United States Patent
Mutlu et al.

(10) Patent No.: US 11,112,233 B2
(45) Date of Patent: Sep. 7, 2021

(54) SELF-MIXING PARTICULATE MATTER SENSORS USING VCSELS WITH EXTRINSIC PHOTODIODES

(71) Applicant: Apple Inc., Cupertino, CA (US)

(72) Inventors: Mehmet Mutlu, Stanford, CA (US); Michael K. Brown, Sunnyvale, CA (US); Wesley S. Smith, Mountain View, CA (US); Orit A. Shamir, San Francisco, CA (US); Richard T. Chen, San Jose, CA (US); Mark T. Winkler, San Jose, CA (US); Miaolei Yan, Santa Clara, CA (US); Richard Yeh, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/569,586

(22) Filed: Sep. 12, 2019

(65) Prior Publication Data

US 2021/0080245 A1    Mar. 18, 2021

(51) Int. Cl.
*H01S 5/183*    (2006.01)
*G01B 9/02*    (2006.01)

(52) U.S. Cl.
CPC ..... *G01B 9/02083* (2013.01); *G01B 9/02041* (2013.01); *H01S 5/18322* (2013.01)

(58) Field of Classification Search
CPC .............. G01B 9/02083; G01B 9/0204; G01B 9/02097; G01B 9/02092; H01S 5/18322
See application file for complete search history.

(56) References Cited

U.S. PATENT DOCUMENTS

| | | | |
|---|---|---|---|
| 7,283,214 B2 | 10/2007 | Xu et al. | |
| 7,604,981 B1* | 10/2009 | Harris, Jr. | G01N 21/6454 422/50 |
| 8,467,428 B2 | 6/2013 | Gerlach et al. | |
| 2016/0290785 A1 | 10/2016 | Baier et al. | |
| 2019/0331473 A1* | 10/2019 | Johnson | G01S 7/4814 |

FOREIGN PATENT DOCUMENTS

WO    WO 2017/218467    12/2017

* cited by examiner

*Primary Examiner* — Jonathan M Hansen
(74) *Attorney, Agent, or Firm* — Morgan, Lewis & Bockius LLP

(57) ABSTRACT

Aspects of the subject technology relate to an apparatus for self-mixing particulate-matter sensing using a vertical-cavity surface-emitting laser (VCSEL) with extrinsic photodiodes. The apparatus includes a dual-emitting light source disposed on a first chip and to generate a first light beam and a second light beam. The first light beam illuminates a particulate matter (PM), and a light detector extrinsic to the first chip measures the second light beam and variations of the second light beam and generates a self-mixing signal. The variations of the second light beam are caused by a back-scattered light resulting from back-scattering of the first light beam from the PM. The light detector is coupled to the dual-emitting light source. The direction of the second light beam is opposite to the direction of the first light beam, and the second light beam is directed to a sensitive area of the light detector.

18 Claims, 9 Drawing Sheets

SELF-MIXING PARTICULATE MATTER SENSORS USING VCSELS WITH EXTRINSIC PHOTODIODES

TECHNICAL FIELD

The present description relates generally to sensors, and more particularly, but not exclusively, to self-mixing particulate matter sensors using vertical-cavity surface-emitting lasers (VCSELs) with extrinsic photodiodes that are not monolithic with the VCSEL die.

BACKGROUND

In self-mixing interferometry, light emitted by a coherent or partially coherent source, e.g., a laser, is reflected and/or scattered from a target and recoupled into the optical cavity of the light source. This recoupling can coherently modify the electric field, carrier distribution, optical gain profile, and lasing threshold of the laser to create a measurable change in the voltage on the laser junction (if the laser is being driven with a current source), a bias current on the laser (if the laser is being driven with a voltage source), and/or the optical power emitted by the laser.

Self-mixing interferometers are sometimes used to measure wind speed by detecting particulates in the wind flow that reflect and/or scatter laser light. Based on the determined speed and the number of detected particulates over time, the particulate matter (PM) concentration in the wind flow can be estimated. The lasers used in many self-mixing interferometers are vertical-cavity surface-emitting lasers (VCSELs) and the light detectors can be semiconductor photodiodes (PDs). Currently, the VCSEL and the semiconductor PD are implemented on the same semiconductor chip using a high-cost, low-yield and complex manufacturing process.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
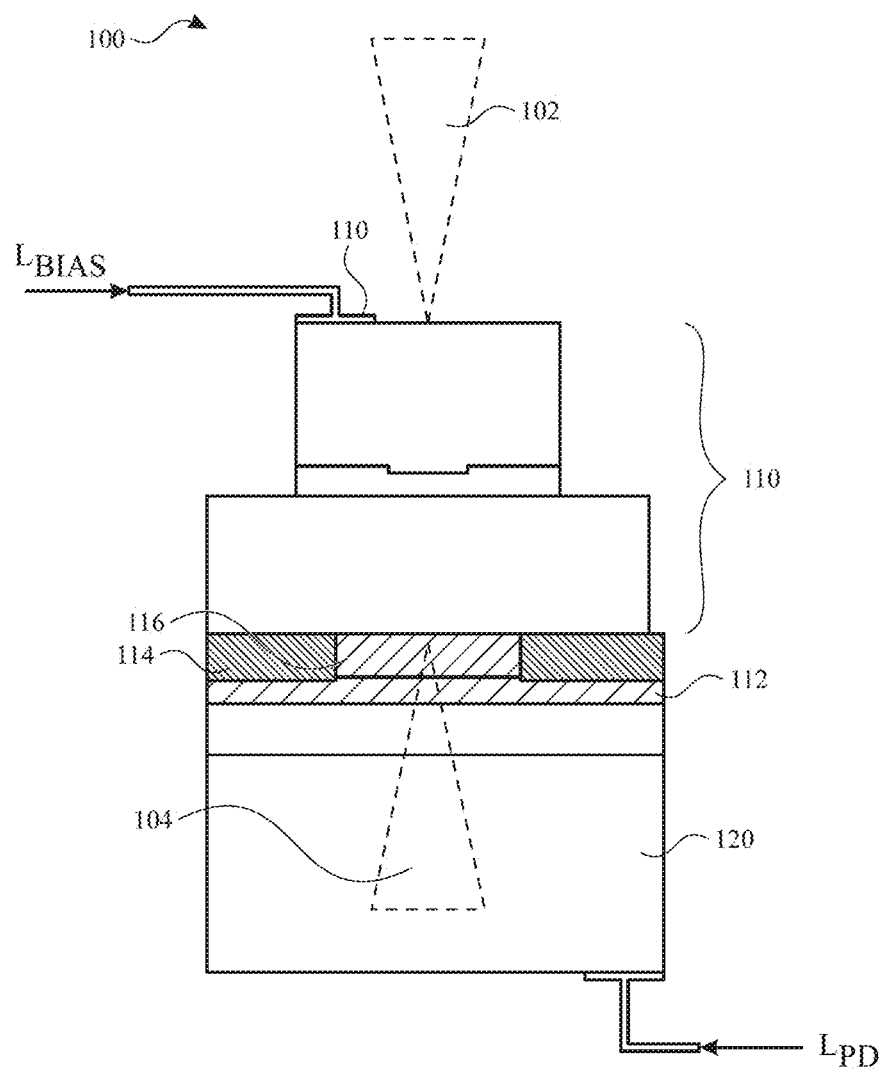
FIG. 1 illustrates a schematic diagram of an example of a self-mixing interferometry (SMI) apparatus using a dual-emitting light source, in accordance with various aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is directed to self-mixing particulate matter (PM) sensors using lasers such as vertical-cavity surface-emitting lasers (VCSELs) with extrinsic photodiodes (PDs). In currently available self-mixing interferometers, the VCSEL and the semiconductor PD are implemented on the same semiconductor chip using a high-cost, low-yield and complex manufacturing process. The subject disclosure describes solutions that allow benefiting from extrinsic PDs, which are low cost and can be manufactured using a high-yield and less-complex manufacturing process.

The extrinsic PDs can either be located on the same chip with the laser (e.g., VCSEL) or on a separate chip. The term "chip," in the context of the subject disclosure, describes a monolithic piece of a die and is not used to embrace pieces of one or more dies that are bonded together. In embodiments that are implemented by having the extrinsic PDs on a separate chip, they can either be located side-by-side with the laser chip or placed under the laser chip, for example, by soldering the laser chip to the top of the PD. In some implementations, when the extrinsic PD and VCSEL are located on the same chip, a beam-splitting element, for example, with parallel flat surfaces can be used to couple a carefully adjusted amount of emitted laser light to the PD. In one or more other implementations, the beam-splitting element can be wedged, curved or shaped differently to couple a desired portion of the light to the PD with minimum leakage. In embodiments with separate laser and PD chips, the beam-splitting element can have a flat or wedged surface, depending on whether the VCSEL and the PD chips are stacked or located side-by-side, respectively.

In some implementations, a dual-emitting light source such as a VCSEL with dual-surface emission simultaneously emitting light from the top and bottom is used. In such implementations, it is possible to avoid using a beam-splitting element. In the implementation using a dual-surface emission VCSEL, a better signal-to-noise ratio (SNR) can also be obtained compared to other extrinsic PD architectures. In this implementation, the apparatus of the subject technology includes a dual-emitting light source disposed on a first chip to generate a first light beam and a second light beam. The first light beam illuminates a PM. A light detector is positioned extrinsic to the first chip to measure the second light beam and variations of the second light beam and to generate a self-mixing signal. The variations of the second light beam result from a back-scattering of the first light beam from the PM. The light detector is coupled to the dual-emitting light source. The direction of the second light beam is opposite of the direction of the first light beam. The second light beam is directed to the light detector to be absorbed by a sensitive area of the light detector.

The apparatus further includes an optically transparent layer disposed in between the VCSEL and the light detector and is optically transparent and electrically and thermally conductive. The second light beam can reach the light detector through the optically transparent layer. The light detector can be a PD, and an electrical contact layer of the VCSEL is electrically isolated from the PD via an optically transparent insulating layer. The laser power of the second light beam can be greater than or equal to the laser power of the first light beam. For example, a good SNR can be achieved when the second light beam reaching the PD has an optical power of about 1.3 times the power of the first beam directed to the PM.

In some implementations, an apparatus for PM sensing includes a light source, a light detector and a beam splitter. The light source is disposed on a first chip to generate a first light beam to illuminate any PM passing through the beam path sensing volume. The light detector is positioned extrinsic to the light source, and the beam splitter can split the first light beam to generate a second light beam directed to the light detector. The light detector can measure the second light beam and variations of the second light beam resulting from a back-scattering of the first light beam from the PM and can generate a self-mixing signal. The light source is a VCSEL, and the light detector is disposed over a VCSEL structure surrounding the VCSEL on the first chip. In some implementations, the light detector is positioned on a second chip that is disposed at a distance from the VCSEL and the beam splitter is a wedge-shaped beam splitter.

FIG. 1 illustrates a schematic diagram of an example of a self-mixing interferometry (SMI) apparatus 100 using a dual-emitting light source 110, in accordance with various aspects of the subject technology. The SMI apparatus 100 includes the dual-emitting light source 110 and a light detector 120. The dual-emitting light source 110 is a dual-emitting VCSEL made of a quantum well and Bragg reflectors implemented on a first chip. The dual-emitting VCSEL 110 can create two vertical beams. In some implementations, the two vertical beams are at a specific wavelength such as about 940 nm. A first beam 102 is a vertical light beam directed away from the dual-emitting light source 110 toward a target such as PMs (not shown herein for simplicity), and the second beam 104 is another vertical light beam directed toward the light detector 120, which is a PD implemented on a second chip.

The PD 120 has a PD contact layer 112 that is coupled to the dual-emitting VCSEL 110 through a window 116 formed in the center of a contact layer 114 of the dual-emitting VCSEL 110. The contact layer 112 is made of an electrically conductive and optically transparent layer such as indium-tin-oxide (ITO), and the contact layer 114 is made of an electrically conductive material such as a metal, for example, gold, copper, tungsten, aluminum or other electrically conductive metals. The window 116 is made of an optically transparent material that is electrically and thermally conductive. The PD 120 measures the second light beam 104 and variations of the second light beam and to generate a self-mixing (SM) signal. In SMI, the light reflected and/or back-scattered from the target (e.g., PM) recouples into a resonant cavity of the dual-emitting VCSEL 110 and causes variation of the light beams generated by the dual-emitting VCSEL 110 that are picked up by the PD 120.

Figure 2:
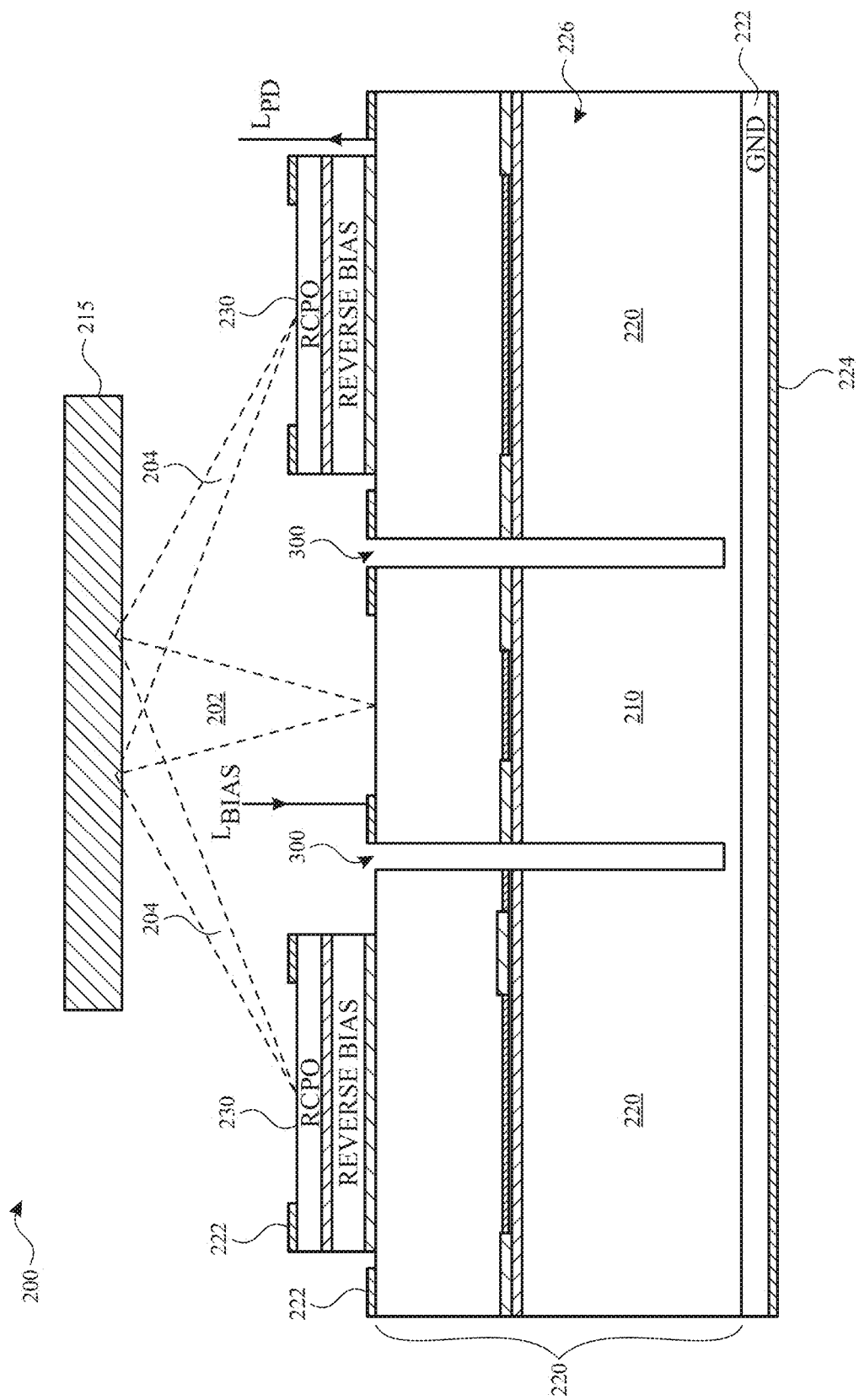
FIG. 2 illustrates a schematic diagram of an example of an SMI apparatus using an extrinsic photodiode (PD), in accordance with various aspects of the subject technology.

FIG. 2 illustrates a schematic diagram of an example of an SMI apparatus 200 using an extrinsic PD, in accordance with various aspects of the subject technology. The SMI apparatus 200 includes a VCSEL 210, a VCSEL structure 220 surrounding the VCSEL 210, a PD 230 and an optical splitter (hereinafter "splitter") 215. The VCSEL 210 and the VCSEL structure 220 are fabricated on the same chip (a first chip) in a single-fabrication process and then are isolated from one another via an isolation trench 300. The first chip includes a substrate 222 on which the VCSEL quantum well layers 226 are created. The substrate 222 is less than 200 μm thick and is coupled to a ground potential (GND) through a metal contact (e.g., gold) 224. The VCSEL 210 is forward biased, while the VCSEL structure 220 is reverse biased to prevent it from being active. The PD 230 is fabricated extrinsic to the VCSEL 210 by additional layers over the VCSEL structure 220. This makes the fabrication process of the PD 230 less complex, because fabricating the PD 230 intrinsic to the VCSEL 210 would involve additional process control and extra etch steps that would result in added cost and lattice-matching concerns.

The splitter 215 can split the first light beam 202 generated by the VCSEL 210 to create a split beam 204 directed to the PD 230, while also allowing forward- and backward-light transmission through the splitter 215. The forward-light transmission is directed to a target such as PM and the backward-light transmission relates to transmission of the back-scattered light from the target to the VCSEL 210. The splitter 215 can be at a distance from the PD 230 ranging between 50 μm to 100 μm. As explained above, in the self-mixing process, the reflected and/or back-scattered light from the target recouples into the resonant cavity of the VCSEL 210 and makes changes to the first light beam 202, the variations of which are sensed by the PD 230 and used to generate a SM signal. In some implementations, the splitter 215 can include a filter layer to remove ambient light from entering the VCSEL 210. Also shown in FIG. 2 are etch stop layers 222 that are used as contacts for the PD 230 and the VCSEL 210 through which the VCSEL bias current ($I_{Bias}$) and PD current ($I_{PD}$) are provided.

Figure 3:
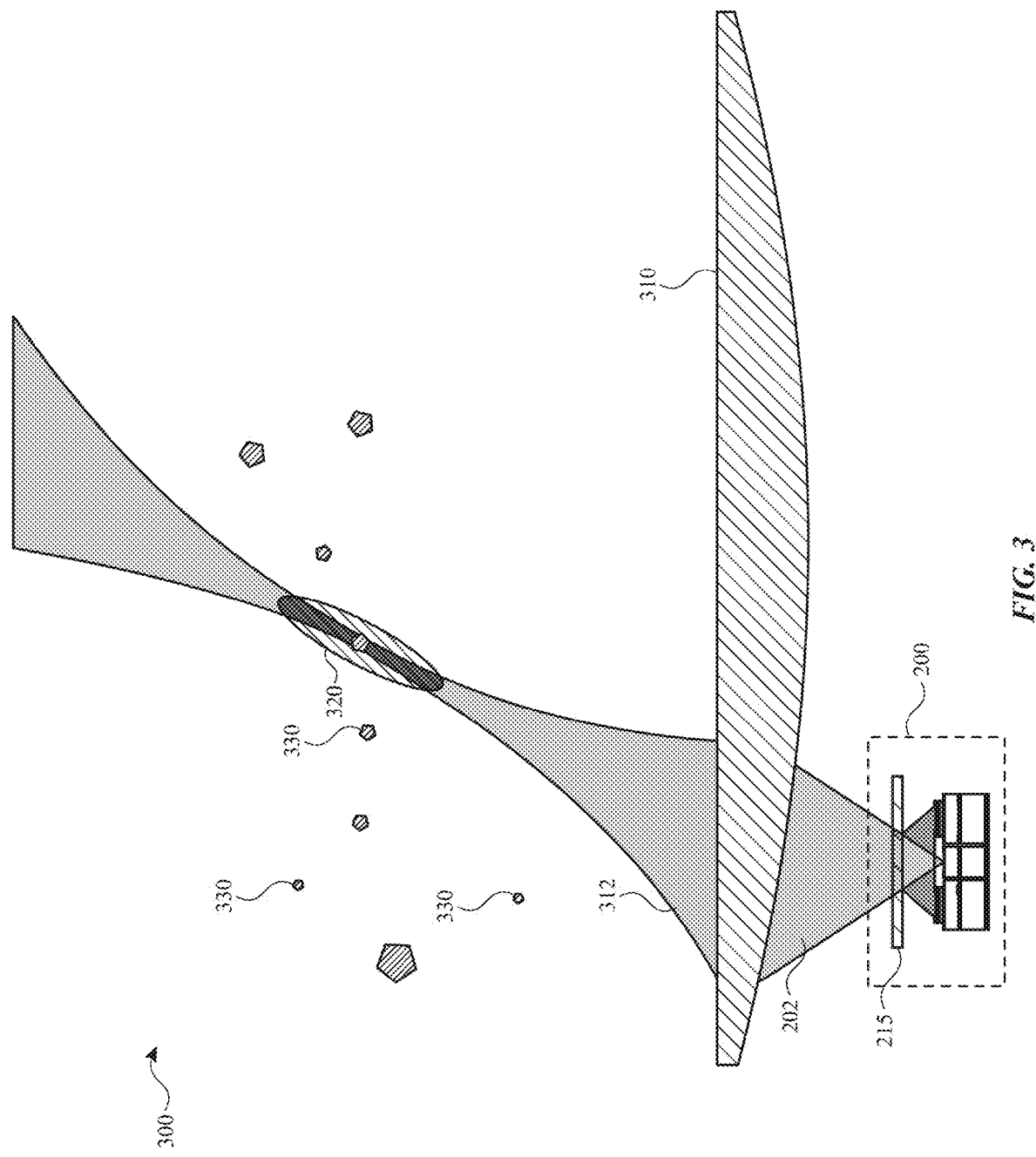
FIG. 3 illustrates a schematic diagram of an example of an SMI apparatus using an extrinsic photodiode (PD) and a focusing element, in accordance with various aspects of the subject technology.

FIG. 3 illustrates a schematic diagram of an example of an SMI apparatus 300 using an extrinsic PD and a focusing element 310 in accordance with various aspects of the subject technology. The heart of the SMI apparatus 300 is the SMI apparatus 200 of FIG. 2 including the splitter 215, which provides the first light beam 202. The first light beam 202 is focused by the focusing element 310 into a sensing volume 320. The reflected and/or back-scattered light from the PM 330 is directed to the VCSEL of the SMI apparatus 200. The focusing element 310 can be a lens made of a transparent optical material such as glass. The distance between the focusing element 310 and the SMI apparatus 200 can be within a range of about 0.5 to 1 mm. In some implementations, the SMI apparatus 200 is an element of an array of more than two elements that can share the same focusing element 310.

Figure 4:
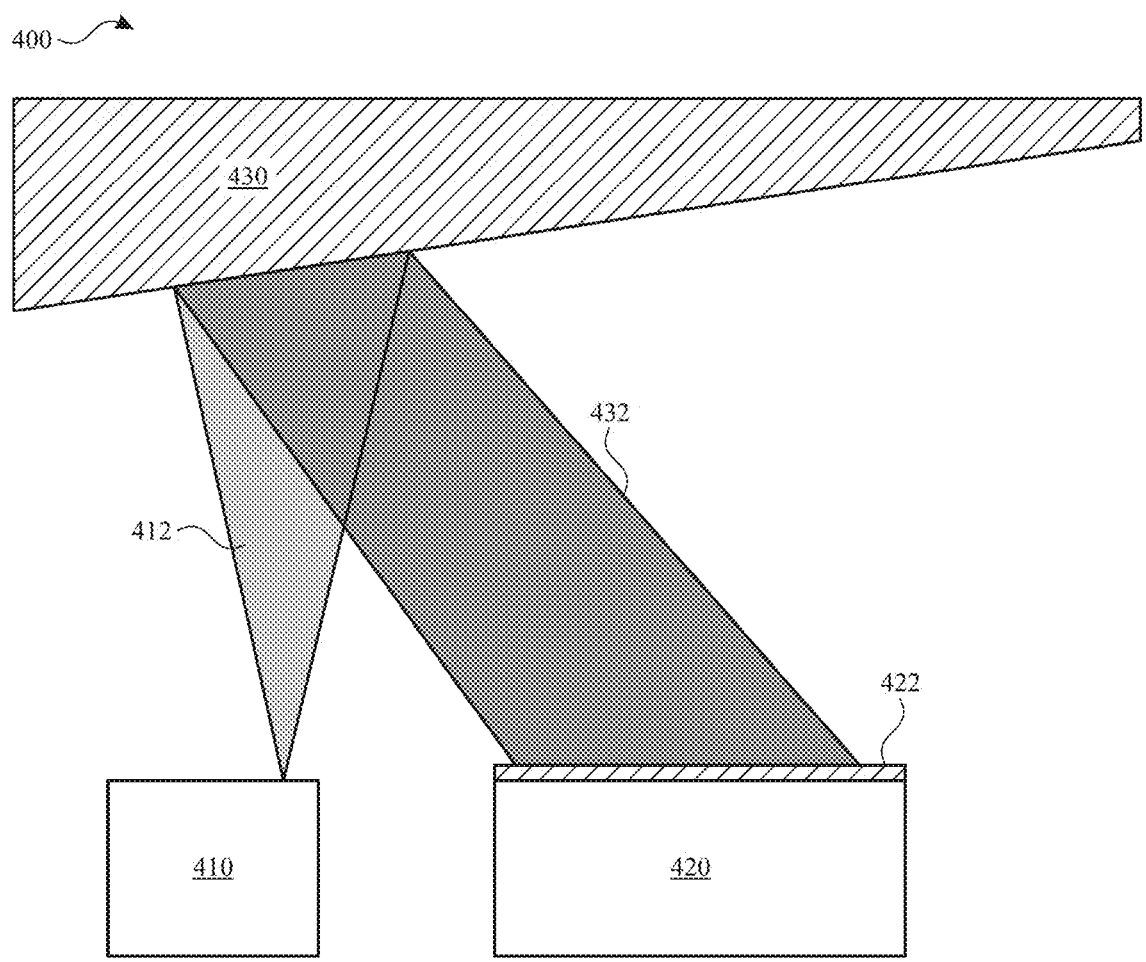
FIG. 4 illustrates a schematic diagram of an example of an SMI apparatus using an extrinsic PD and a beam splitter, in accordance with various aspects of the subject technology.

FIG. 4 illustrates a schematic diagram of an example of an SMI apparatus 400 using an extrinsic PD 420 and a beam splitter 430, in accordance with various aspects of the subject technology. The SMI apparatus 400 includes the VCSEL 410, the extrinsic PD 420 and the beam splitter 430. The VCSEL 410 is similar to the VCSEL 210 of FIG. 2 and is fabricated on a first chip. The extrinsic PD 420 is implemented on a separate chip (second chip) and disposed on the side of the VCSEL 410 at a distance within a range of about 100 µm to 300 µm. The VCSEL 410 generates a light beam 412 that is split by the beam splitter 430, which can be either a wedge splitter with a wedge angle within a range of about 6-8 degrees or a diffraction grating having $0^{th}$ order and $\pm 1^{st}$ order diffractions aligned to that locations of the VCSEL 410 and the extrinsic PD 420, respectively. The beam splitter 430 can be made of a transparent optical material such as glass and can be disposed at a distance within a range of about 100 µm to 500 µm. In some implementations, the beam splitter 430 can be made of a flat-plate birefringent beam splitter and/or prism that looks like a plate of glass (with no wedge) and may be easier to assemble. In one or more implementations, the PD 420 can be a low-price standard PD and can be covered with an optical filter layer 422 to shield the PD 420 from the ambient light.

Figure 5:
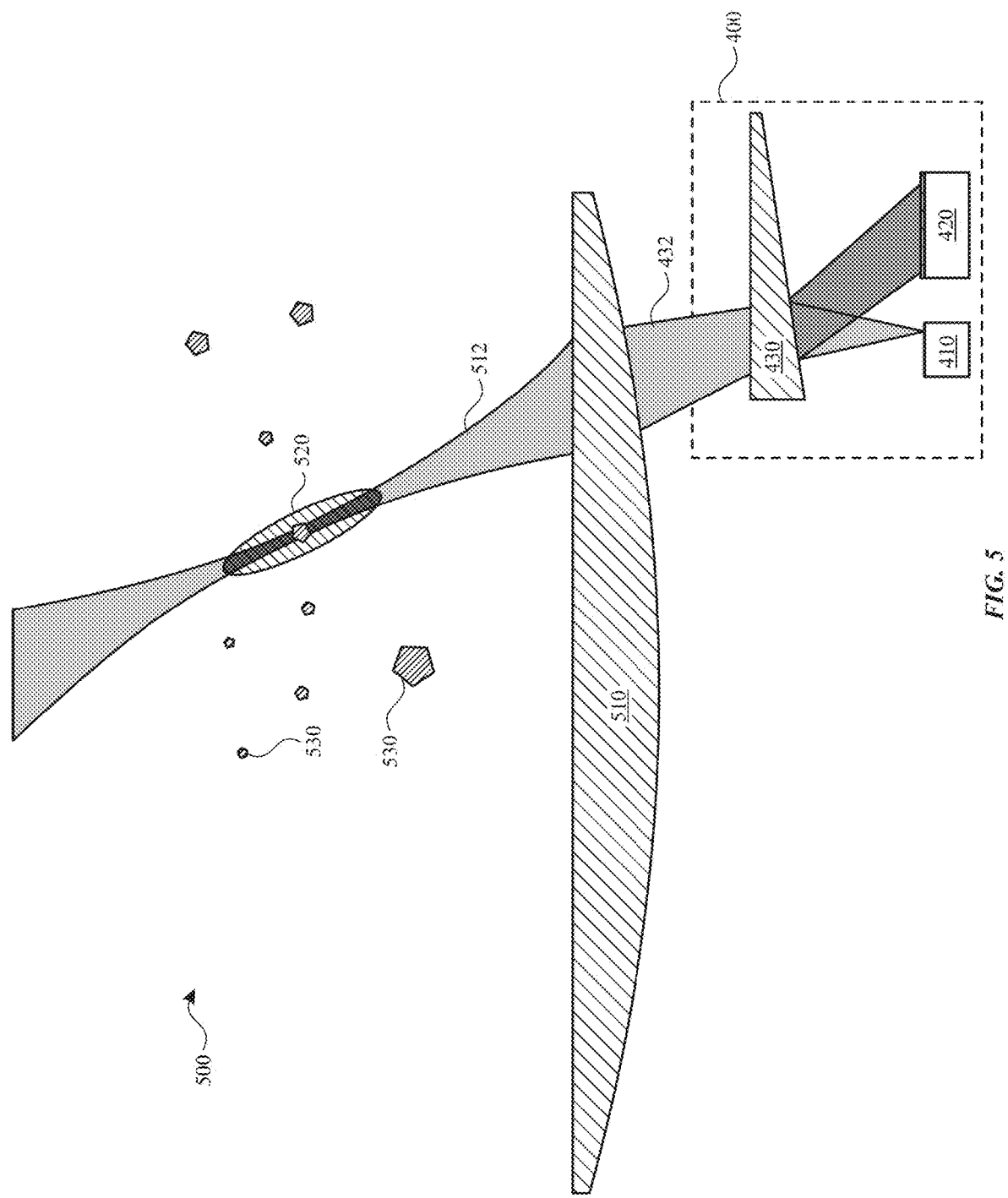
FIG. 5 illustrates a schematic diagram of an example of an SMI apparatus using an extrinsic PD, a beam splitter and a focusing element, in accordance with various aspects of the subject technology.

FIG. 5 illustrates a schematic diagram of an example of an SMI apparatus 500 using an extrinsic PD 420, a beam splitter 430 and a focusing element 510, in accordance with various aspects of the subject technology. The heart of the SMI apparatus 500 is the SMI apparatus 400 of FIG. 4 including the VCSEL 410, the extrinsic PD 420 and the beam splitter 430. The SMI apparatus 400, as explained above, generates the first optical beam 432 that is focused by the focusing element 510 that focuses the transmitted beam into a sensitive volume 520 to be reflected and/or back-scattered by a target such as the PM 530. The back-scattered beam 512 is collected by the focusing element 510 and directed via transmission through the beam splitter 430 into the VCSEL 410. In some implementations, the SMI apparatus 400 is an element of an array of more than two elements that can share the same focusing element 510.

Figure 6:
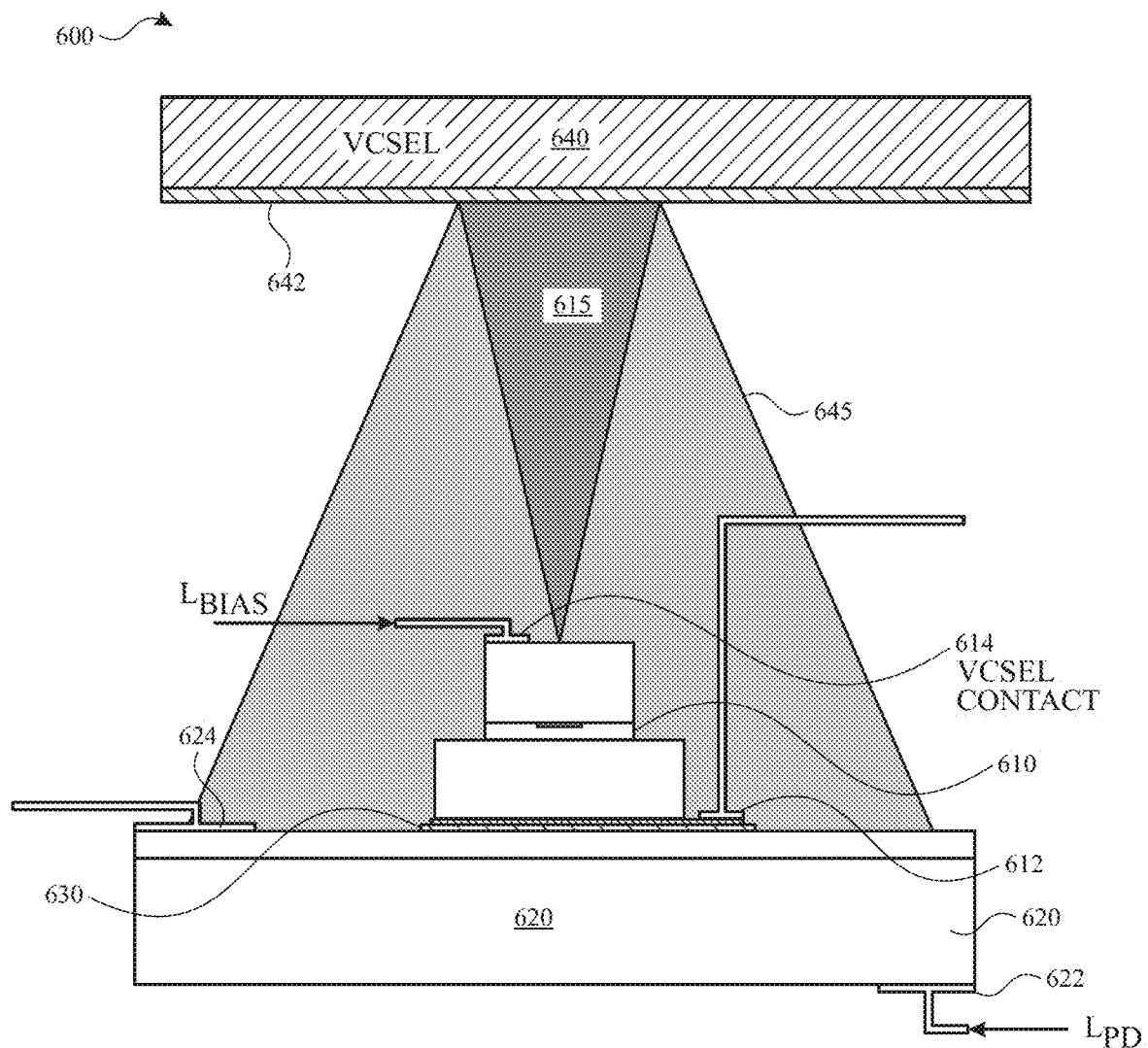
FIG. 6 illustrates a schematic diagram of an example of an SMI apparatus using an off-chip extrinsic PD and a beam splitter, in accordance with various aspects of the subject technology.

FIG. 6 illustrates a schematic diagram of an example of an SMI apparatus 600 using an off-chip extrinsic PD and a beam splitter, in accordance with various aspects of the subject technology. The SMI apparatus 600 includes a VCSEL 610, a PD 620 and a beam splitter 640. The VCSEL 610 is created on a first chip and the PD 620 is an extrinsic PD fabricated on a second chip. The first chip and the second chip are then assembled using an electrical insulation layer 630 insulating the first chip from the second chip. A portion of the second chip that is not covered by the first chip forms the active part of the PD 620. The PD 620 includes conductive (e.g., metal) contacts 622 and 624, and the $I_{PD}$ enters the PD 620 through the metal contact 622. The VCSEL 610 includes metal contacts 612 and 614, and the $I_{Bias}$ of the VCSEL 610 enters through the metal contact 614.

In some implementations, the beam splitter 640 includes a filter layer 642 that is a band-pass filter that can filter out the ambient light and allow the light with a wavelength such as about 940 nm to pass through. The VCSEL 610 generates a first light beam 615 that is split by the beam splitter 640 to generate the beams 645 directed to the active portions of the PD 620. The beam splitter 640 transmits a portion of the first light beam 615 through to reach a target (not shown for simplicity) and directs a reflected and/or back-scattered beam from the target to the VCSEL 610. As explained above, the back-scattered beam can recouple into the resonant cavity of the VCSEL 610 and cause variations of the first light beam 615, which in turn changes the beams 645 reaching the active regions of the PD 620. These variations are sensed by the PD 620 and converted to SM signals that can be processed by a processor of a host device (e.g., a smartphone).

FIGS. 7A, 7B, 7C and 7D are diagrams illustrating a parallel SMI system for measuring PM velocity components and corresponding SM signals, in accordance with one or more aspects of the subject technology. The parallel SM sensing system (hereinafter, "SM sensing system 700A") is an example application of the subject technology and includes a first SM module 701. The first SM module 701 includes a first light source and detector unit 702, a first optical element (e.g., lens) 706, a second light source and detector unit 704 and a second optical element (e.g., a lens, or a microlens array) 708. The first light source and detector unit 702 can be a monolithically integrated unit including a first light source and a first PD. In some implementations, the first light source is a laser source such as a first VCSEL, and the first PD is an intra- or extra-cavity PD monolithically integrated with the first VCSEL. Similarly, the second light source and detector unit 704 can be a monolithically integrated unit including a second light source such as a second VCSEL and a second PD integrated similarly with the second VCSEL.

The first VCSEL generates the first light beam 710, and the second VCSEL generates a second light beam 712. A center point, defined as the point with the highest irradiance on the transverse plane where the laser beam has the smallest footprint, i.e., the focal point, of the first light beam 710 is at a distance $\Delta X$ from a center point of the second light beam 712. The value of the distance $\Delta X$ can be within a range of about 75 µm to 700 µm when two VCSELs are used. However, in the Laguerre-Gaussian implementation, $\Delta X$ would be within a range of about 0.25 µm to 2.5 µm. A focal region 720 includes focal points of the first light beam 710 and the second light beam 712. A PM 715 moving in the focal region 720 can be characterized by the SM sensing system 700A. For example, when the PM 715 passes through one of the first light beam 710 or the second light beam 712, an absolute value of the respective velocity in the Z direction ($|V_z|$) can be measured from the Doppler shift using the SMI technique. For example, when the PM 715 is passing near the focal point of the first light beam 710, it can scatter part of the first light beam 710, a portion of which can reach and recouple with the resonant cavity of the first VCSEL. Upon this coherent interaction, the first PD can detect a first SM signal and measure a first timing associated with the first signal.

As the PM 715 moves in the focal region 720, it may pass near a focal point of the second light beam 712, it can scatter part of the second light beam 712, a portion of which can reach and recouple with the resonant cavity of the second VCSEL. Upon this coherent interaction, the second PD can detect a second SM signal and measure a second timing associated with the second signal. The time difference $\Delta T$ between the first timing ($T_0$) and the second timing ($T_1$) can be used (e.g., by a processor) to determine a horizontal velocity component ($V_x$) of the PM 715 by simply dividing the distance traveled ($\Delta X$) by the PM 715 in X direction to the time difference $\Delta T$ ($V_x = \Delta X / \Delta T$). The processor can be, for example, a processor of a host device such as a smartphone or a smartwatch.

In one or more implementations, the first and second PDs can be separate from the first and second VCSELs and be positioned by the side of the VSCEL, for example, be implemented as side PDs on the chip. In these implementations, a cover glass on a separate beam-splitting element with a beam splitting ratio can be used to reflect the first and second light beams 712 and 712 to the side PDs, of which the main purpose is to monitor optical power levels of the reflected lights. The power levels of the light reflected from the cover glass and/or the separate beam-splitting element is a measure of the optical output power levels of the first and second VCSELs. SM interference induced by the PM 715 perturbs the output power of the VCSELs and therefore, results in a measurable signal on the corresponding PDs.

In some implementations, the first and the second light beams can be realized based on a single laser source (e.g., first VCSEL). In these implementations, the single beam of the single laser source can be converted into a higher order Laguerre-Gaussian beam having two separate lobes 725. Each lobe of the lobes 725 realizes one of the first and the second light beams 710 and 712 and can be used similarly to characterize the PM 715, as described above. In this implementation, the SM signal can be read from a single PD.

Figure 7A:
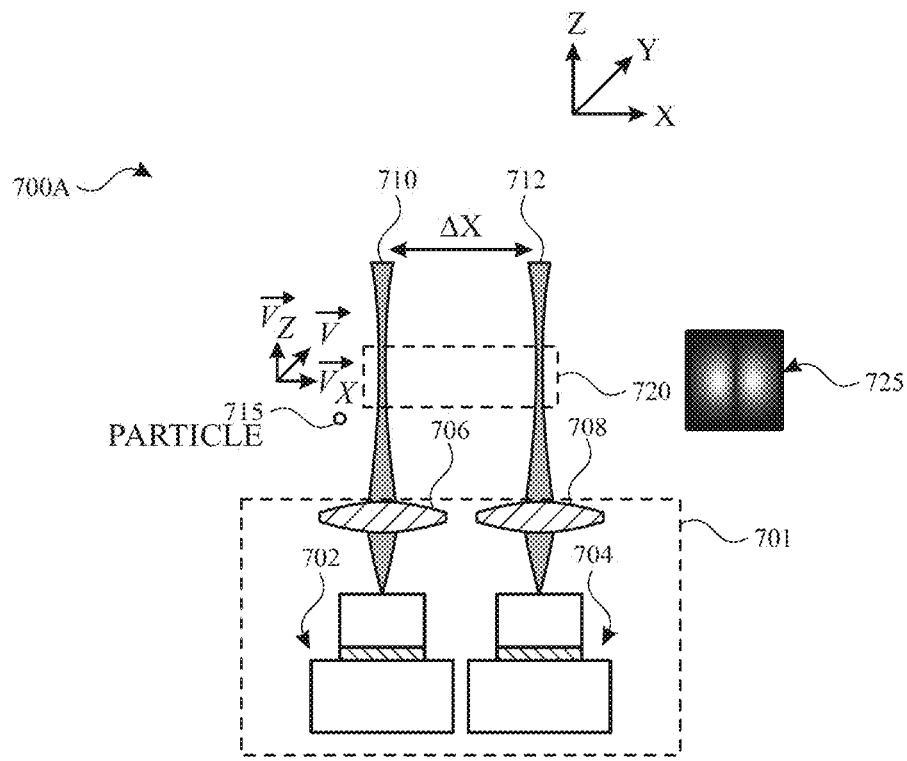
FIGS. 7A, 7B, 7C and 7D are diagrams illustrating a parallel SMI system for measuring particulate matter velocity components and corresponding self-mixing signals, in accordance with one or more aspects of the subject technology.
Figure 7B:
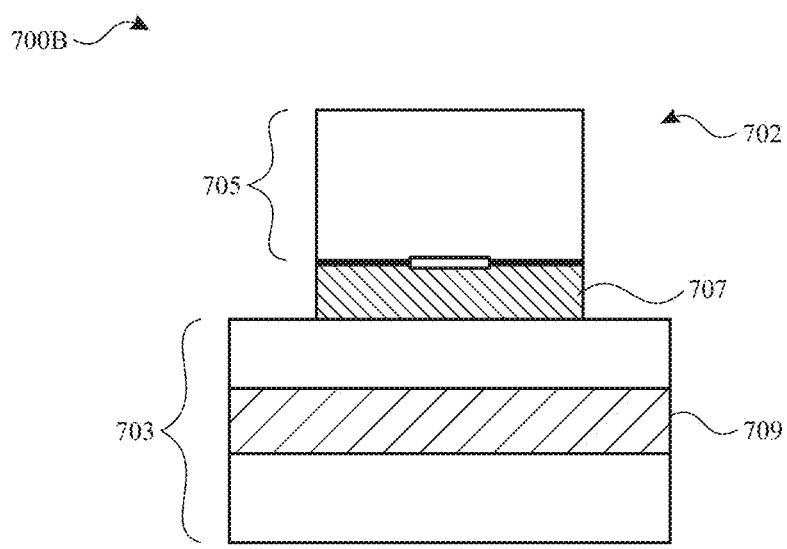

A cross-sectional view 700B of a structure of a light source and detector unit (e.g., 702) is shown in FIG. 7B. In one or more implementations, as shown in FIG. 7B, the light source and detector unit 702 (or 704) is a monolithic VCSEL-PD unit and includes a top distributed brag reflector (DBR) 705, a multiquantum well active region 707 and a bottom DBR 703. In some implementations, the VCSEL can be the dual-emitting VCSEL of the subject technology, as shown and discussed above with respect to FIG. 1. The bottom DBR 703 includes an intra-cavity PD layer 709.

Figure 7C:
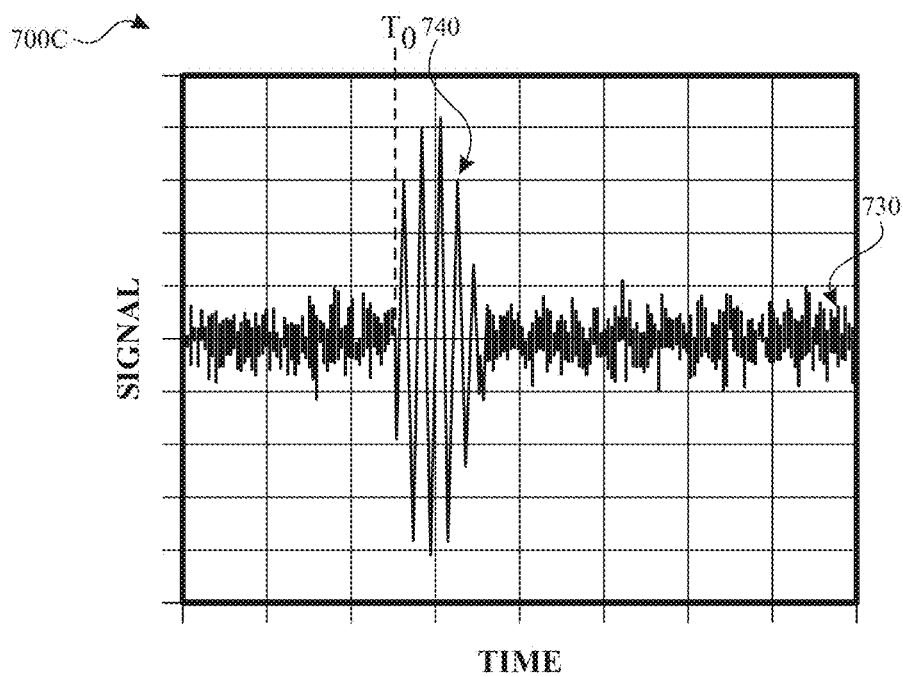

The chart 700C, shown in FIG. 7C, represents a signal registered by the first PD of the first light source and detector unit 702. The registered signal includes a background (e.g., noise) 730 and a first SM signal 740. The first timing $T_0$ is a starting time of the first SM signal 740. Alternatively, $T_0$ can be defined as the peak point of the envelope of the first SM signal 740.

Figure 7D:
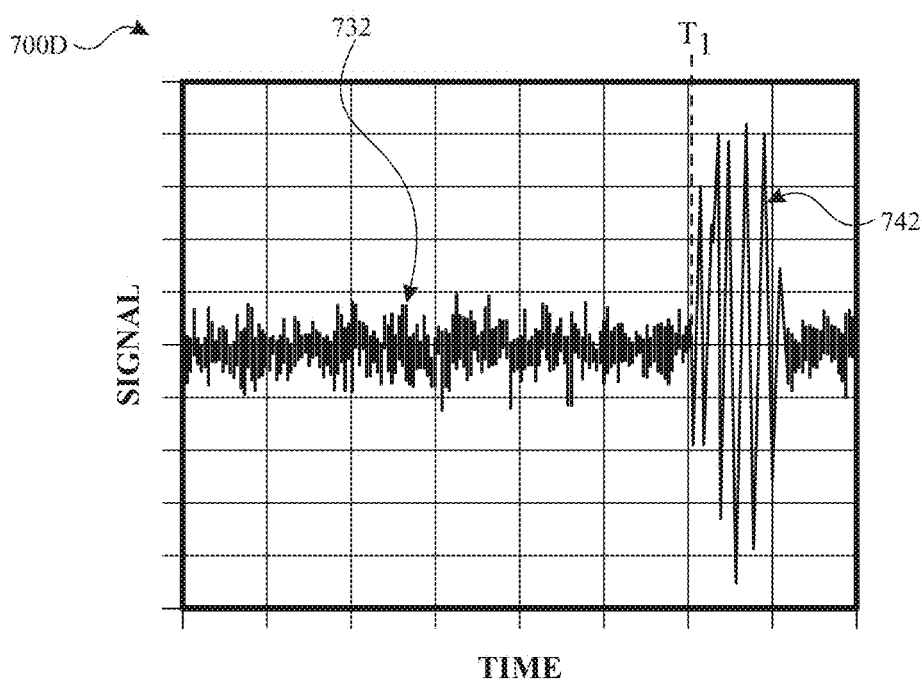

The chart 700D, shown in FIG. 7D, represents a signal registered by the second PD of the second light source and detector unit 704. The registered signal in this case includes a background (e.g., noise) 732 and a second SM signal 742. The second timing $T_1$ is a starting time of the second SM signal 742. Alternatively, $T_1$ can be defined as the peak point of the envelope of the second SM signal 742. As described above, the time difference $\Delta T=T_1-T_0$ can be used to fully determine a value of a velocity $V_x$ of the PM 715 along the X axis. In addition, the direction of the PM 715 motion along the X axis can be determined by comparing $T_0$ to $T_1$.

Figure 8:
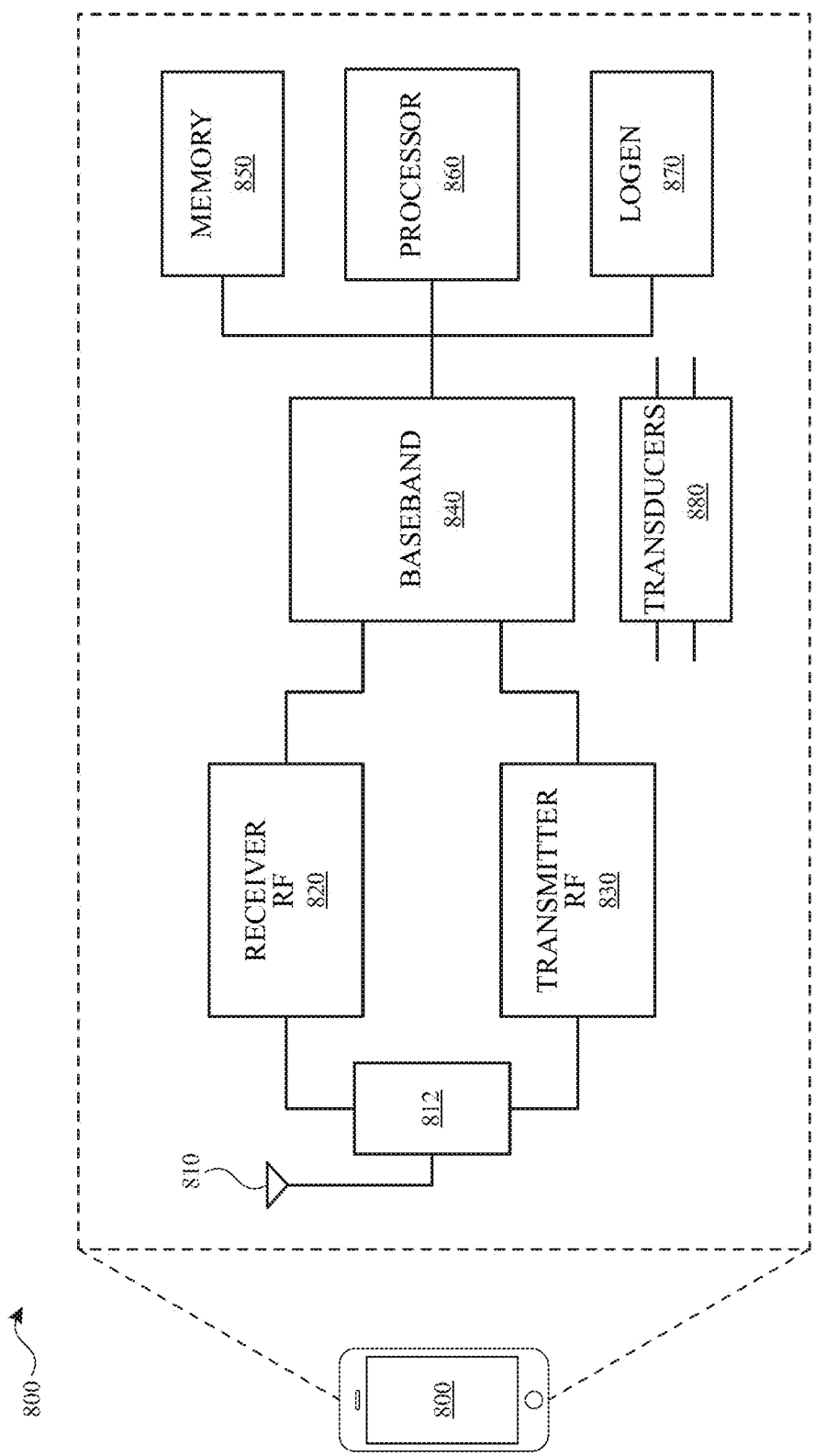
FIG. 8 illustrates a wireless communication device within which some aspects of the subject technology are implemented.

FIG. 8 illustrates a wireless communication device 800 within which some aspects of the subject technology are implemented. In one or more implementations, the wireless communication device 800 can be a smartphone or a smartwatch that hosts an apparatus of the subject technology including an apparatus for SM PM sensing using a VCSEL with extrinsic PDs. The wireless communication device 800 may comprise a radio-frequency (RF) antenna 810, a duplexer 812, a receiver 820, a transmitter 830, a baseband processing module 840, a memory 850, a processor 860, a local oscillator generator (LOGEN) 870, and a transducer 880. In various embodiments of the subject technology, one or more of the blocks represented in FIG. 8 may be integrated on one or more semiconductor substrates. For example, the blocks 820-870 may be realized in a single chip or a single system on a chip, or may be realized in a multichip chipset.

The receiver 820 may comprise suitable logic circuitry and/or code that may be operable to receive and process signals from the RF antenna 810. The receiver 820 may, for example, be operable to amplify and/or down-convert received wireless signals. In various embodiments of the subject technology, the receiver 820 may be operable to cancel noise in received signals and may be linear over a wide range of frequencies. In this manner, the receiver 820 may be suitable for receiving signals in accordance with a variety of wireless standards, such as Wi-Fi, WiMAX, Bluetooth, and various cellular standards. In various embodiments of the subject technology, the receiver 820 may not use any saw-tooth acoustic wave (SAW) filters and few or no off-chip discrete components such as large capacitors and inductors.

The transmitter 830 may comprise suitable logic circuitry and/or code that may be operable to process and transmit signals from the RF antenna 810. The transmitter 830 may, for example, be operable to up-convert baseband signals to RF signals and amplify RF signals. In various embodiments of the subject technology, the transmitter 830 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 830 may be operable to provide signals for further amplification by one or more power amplifiers.

The duplexer 812 may provide isolation in the transmit band to avoid saturation of the receiver 820 or damaging parts of the receiver 820, and to relax one or more design requirements of the receiver 820. Furthermore, the duplexer 812 may attenuate the noise in the receive band. The duplexer 812 may be operable in multiple frequency bands of various wireless standards.

The baseband processing module 840 may comprise suitable logic, circuitry, interfaces, and/or code that may be operable to perform processing of baseband signals. The baseband processing module 840 may, for example, analyze received signals and generate control and/or feedback signals for configuring various components of the wireless communication device 800, such as the receiver 820. The baseband processing module 840 may be operable to encode, decode, transcode, modulate, demodulate, encrypt, decrypt, scramble, descramble, and/or otherwise process data in accordance with one or more wireless standards.

The processor 860 may comprise suitable logic, circuitry, and/or code that may enable processing data and/or controlling operations of the wireless communication device 800. In this regard, the processor 860 may be enabled to provide control signals to various other portions of the wireless communication device 800. The processor 860 may also control transfer of data between various portions of the wireless communication device 800. Additionally, the processor 860 may enable implementation of an operating system or otherwise execute code to manage operations of the wireless communication device 800. In one or more implementations, the processor 860 can be used to process signals of the PDs (e.g., 120 of FIG. 1) of the subject technology.

The memory 850 may comprise suitable logic, circuitry, and/or code that may enable storage of various types of information such as received data, generated data, code, and/or configuration information. The memory 850 may comprise, for example, RAM, ROM, flash, and/or magnetic storage. In various embodiments of the subject technology, information stored in the memory 850 may be utilized for configuring the receiver 820 and/or the baseband processing module 840. In some implementations, the memory 850 may store image information from processed and/or unprocessed fingerprint images of the under-display fingerprint sensor of the subject technology. The memory 850 may also include one or more databases of reference fingerprints that can be used to identify and/or authenticate a person associated with the fingerprint.

The LOGEN 870 may comprise suitable logic, circuitry, interfaces, and/or code that may be operable to generate one or more oscillating signals of one or more frequencies. The LOGEN 870 may be operable to generate digital and/or analog signals. In this manner, the LOGEN 870 may be operable to generate one or more clock signals and/or sinusoidal signals. Characteristics of the oscillating signals such as the frequency and duty cycle may be determined based on one or more control signals from, for example, the processor 860 and/or the baseband processing module 840.

In operation, the processor 860 may configure the various components of the wireless communication device 800 based on a wireless standard according to which it is desired to receive signals. Wireless signals may be received via the RF antenna 810, amplified, and down-converted by the receiver 820. The baseband processing module 840 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 800, data to be stored to the memory 850, and/or information affecting and/or enabling operation of the wireless communication device 800. The baseband processing module 840 may modulate, encode, and perform other processing on audio, video, and/or control signals to be transmitted by the transmitter 830 in accordance with various wireless standards.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitries. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW), flash memory (e.g., SD cards, mini-SD cards, micro-SD cards), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multicore processors that execute software, some implementations are performed by one or more integrated circuits, such as application-specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer-readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

Many of the above-described features and applications are implemented as software processes that are specified as a set of instructions recorded on a computer readable storage medium (also referred to as a computer-readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as subparts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus comprising:
   a dual-emitting light source disposed on a first chip and configured to generate a first light beam and a second light beam, the first light beam being configured to illuminate a particulate matter (PM); and
   a light detector extrinsic to the first chip and configured to measure the second light beam and variations of the second light beam and to generate a self-mixing signal, wherein:
   the dual-emitting light source comprises a vertical-cavity surface-emitting laser (VCSEL),
   the light detector comprises a photodiode (PD) positioned on a second chip that includes a VCSEL structure and surrounds the VCSEL on the first chip,
   the variations of the second light beam are caused by a back-scattered light resulting from back-scattering of the first light beam from the PM,
   the light detector is coupled to the dual-emitting light source,
   a direction of the second light beam is opposite to the direction of the first light beam, and
   the second light beam is directed from the dual-emitting light source to the light detector through an optically transparent layer that is electrically and thermally conductive and is attached to the light detector.

2. The apparatus of claim 1, wherein the optically transparent layer is disposed in between the VCSEL and the light detector.

3. The apparatus of claim 2, wherein an electrical contact layer of the VCSEL is electrically isolated from the PD via the optically transparent layer.

4. The apparatus of claim 3, wherein a second laser power associated with the second light beam is equal or more than a first laser power associated with the first light beam.

5. The apparatus of claim 1, wherein the back-scattered light is configured to recouple into a resonant cavity of the dual-emitting light source and to cause the variations of the second light beam.

6. An apparatus for PM sensing, the apparatus comprising:
   a light source disposed on a first chip and configured to generate a first light beam to illuminate a particulate matter (PM);
   a light detector extrinsic to the light source; and
   a beam splitter configured to split the first light beam to generate a second light beam directed to the light detector,
   wherein:
   the light source comprises a vertical-cavity surface-emitting laser (VCSEL),
   the light detector comprises a photodiode (PD) positioned on a second chip that includes a VCSEL structure, and
   the PD is configured to measure the second light beam and variations of the second light beam resulting from a back-scattered light created due to back scattering of the first light beam from the PM and to generate a self-mixing signal.

7. The apparatus of claim 6, wherein the VCSEL structure is configured to surround the VCSEL on the first chip.

8. The apparatus of claim 7, wherein the VCSEL structure surrounding the VCSEL is structurally similar to the VCSEL and is isolated from the VCSEL using a trench isolation region and is reverse biased.

9. The apparatus of claim 8, further comprising an optical element configured to:
focus a portion of the first light beam transmitted through the beam splitter to a sensing volume for sensing the PM, and
direct the back-scattered light through the beam splitter to the VCSEL.

10. The apparatus of claim 9, wherein the beam splitter comprises on of a wedge-shaped beam splitter with a wedge angle within 6-8 degrees or a diffraction grating having $0^{th}$ order and $\pm 1^{st}$ order diffractions aligned to locations of the VCSEL and the PD, respectively.

11. The apparatus of claim 10, wherein the wedge-shaped beam splitter is further configured to focus a portion of the first light beam transmitted through the wedge-shaped beam splitter to a sensing volume for sensing the PM.

12. The apparatus of claim 10, further comprising an optical element configured to:
focus a portion of the first light beam transmitted through the wedge-shaped beam splitter to a sensing volume for sensing the PM, and
direct the back-scattered light through the beam splitter to the VCSEL.

13. The apparatus of claim 6, further comprising an electrical insulation layer and an optical band-pass filter disposed between the light source and the PD.

14. The apparatus of claim 6, further comprising: an electrical insulation layer disposed between the light source and the PD, and an optical band-pass filter implemented over the beam splitter and configured to remove ambient light.

15. An electronic device comprising:
a processor; and
a particulate matter sensing device comprising:
 a dual-emitting vertical-cavity surface-emitting laser (VCSEL) disposed on a first chip and configured to generate a first light beam and a second light beam, the first light beam being configured to illuminate a particulate matter (PM); and
 a photodiode (PD) extrinsic to the first chip
 and is configured to measure the second light beam and variations of the second light beam and to generate a self-mixing signal,
 wherein:
 the PD is disposed on a second chip underneath the VCSEL,
 the variations of the second light beam are caused by recoupling into a resonant cavity of the dual-emitting VCSEL by a back-scattered light,
 the back-scattered light results from back-scattering of the first light beam from the PM,
 the PD is coupled to the dual-emitting VCSEL,
 a direction of the second light beam is opposite to the direction of the first light beam, and
 the second light beam is directed from the dual-emitting VCSEL to PD through an optically transparent layer that is electrically and thermally conductive and is attached to the PD.

16. The electronic device of claim 15, wherein the optically transparent layer is disposed in between the VCSEL and the PD, and wherein the second light beam is configured to reach a sensitive area of the PD through the optically transparent layer.

17. The apparatus of claim 15, further comprising an electrical insulation layer and an optical band-pass filter disposed between the light source and the PD.

18. The apparatus of claim 15, further comprising:
an electrical insulation layer disposed between the light source and the PD, and
an optical band-pass filter implemented over the beam splitter and configured to remove ambient light.

\* \* \* \* \*

UNITED STATES PATENT AND TRADEMARK OFFICE
CERTIFICATE OF CORRECTION

PATENT NO. : 11,112,233 B2  
APPLICATION NO. : 16/569586  
DATED : September 7, 2021  
INVENTOR(S) : Mehmet Mutlu et al.

Page 1 of 1

It is certified that error appears in the above-identified patent and that said Letters Patent is hereby corrected as shown below:

In the Claims

Column 13, Line 19 (Claim 10), "comprises on of a wedge-shaped beam splitter" should read --comprises one of a wedge-shaped beam splitter--.

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*